(12) United States Patent
Appenzeller et al.

(10) Patent No.: US 7,180,107 B2
(45) Date of Patent: Feb. 20, 2007

(54) METHOD OF FABRICATING A TUNNELING NANOTUBE FIELD EFFECT TRANSISTOR

(75) Inventors: Joerg Appenzeller, Valhalla, NY (US); Joachim Knoch, Herzogenrath (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/852,891

(22) Filed: May 25, 2004

(65) Prior Publication Data
US 2005/0274992 A1    Dec. 15, 2005

(51) Int. Cl.
*H01L 29/72* (2006.01)
(52) U.S. Cl. ............... 257/288; 257/9; 438/197; 438/217; 977/734; 977/742; 977/749; 977/815; 977/755; 977/938; 977/855
(58) Field of Classification Search ........... 257/288, 257/314, 9; 438/618, 197, 217; 977/734, 977/742, 749, 755, 815, 855, 938
See application file for complete search history.

(56) References Cited

U.S. PATENT DOCUMENTS

| | | | |
|---|---|---|---|
| 6,331,262 B1 * | 12/2001 | Haddon et al. | ............. 252/502 |
| 6,515,339 B2 | 2/2003 | Shin et al. | ................... 257/368 |
| 6,524,920 B1 | 2/2003 | Yu | ............................. 438/303 |
| 2002/0005544 A1 * | 1/2002 | Fujiwara | ..................... 257/314 |
| 2002/0130333 A1 | 9/2002 | Watanabe et al. | ........... 257/200 |
| 2004/0061422 A1 | 4/2004 | Avouris et al. | |
| 2004/0253805 A1 * | 12/2004 | Dubin et al. | ................ 438/618 |

FOREIGN PATENT DOCUMENTS

JP    8-107064    4/1996

OTHER PUBLICATIONS

Avouris, et al., "Carbon Nanotube Electronics," Proc. IEEE, 91(11), Nov. 2003, 1772-1784.
Avouris, P., "Molecular Electronics with Carbon Nanotubes," Acc. Chem.Res. 2002, 35, 1026-1034.
Bachtold, et al., "Logic Circuits with Carbon Nanotube Transistors," Science. Nov. 9, 2001; 294(5545):1317-20. Epup Oct. 4, 2001.
Hansch, et al., "Performance Improvement in Vertical Surface Tunneling Transistors by a Boron Surface Phase," Jpn. J. Appl. Phys, 40, 2001, 3131-3136.
Kong, et al., "Chemical profiling of single nanotubes: Intramolecular *p-n-p* junctions and on-tube single-electron transistors," Applied Physics Letters, 80(1), Jan. 7, 2002, 73-75.

(Continued)

*Primary Examiner*—Edward Wojciechowicz
(74) *Attorney, Agent, or Firm*—Patterson & Sheridan, LLP; Kin-Wah Tong, Esq.; Ido Tuchman, Esq.

(57) ABSTRACT

A method of fabricating a tunneling nanotube field effect transistor includes forming in a nanotube an n-doped region and a p-doped region which are separated by an undoped channel region of the transistor. Electrical contacts are provided for the doped regions and a gate electrode that is formed upon a gate dielectric layer deposited on at least a portion of the channel region of the transistor.

30 Claims, 8 Drawing Sheets

OTHER PUBLICATIONS

Javey, et al., "High-k dielectrics for advanced carbon-nanotube transistors and logic gates," Nature Materials, vol. 1, Dec. 2002, 241-246 Published online: Nov. 17, 2002, doi: 10.1038/nmat769, www.nature.com/naturematerials/naturematerials.

Leonard, et al., "Multiple Functionality in Nanotube Transistors," Physical Review Letters, 88(25), Jun. 24, 2002, 258302-1-4.

Mertel, et al., "Single- and multi-wall carbon nanotube field-effect transistors," Applied Physics Letters, 73 (17), Oct. 1998, 2447-2449.

Sedlmaier et al. "Phonon assisted tunneling in gated p-i-n diodes" Materials Science & Engineering B, 89, 2002, 116-119.

Tans, et al., "Room-temperature transistor based on a single carbon nanotube," Nature, 393, May 1998, 49-52.

Zhou, et al., "Modulated Chemical Doping of Individual Carbon Nanotubes," Science, 290, Nov. 24, 2000, 1552-1555.

Copy of International Search Report and Written Opinion for PCT/US05/18201; mailed Sep. 22, 2006; received Sep. 26, 2006; copy consists of 9 unnumbered pages.

* cited by examiner

METHOD OF FABRICATING A TUNNELING NANOTUBE FIELD EFFECT TRANSISTOR

BACKGROUND OF THE INVENTION

1. Field of the Invention

The present invention generally relates to methods of fabricating devices on semiconductor substrates. More specifically, the present invention relates to a method of fabricating a tunneling nanotube field effect transistor on a semiconductor substrate.

2. Description of the Related Art

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits. In particular, the threshold voltage $V_{th}$ (i.e., voltage that is necessary to turn a transistor ON) is reduced in such transistors.

Switching characteristics of a CMOS transistor may be described by a parameter known in the art as an inverse sub-threshold slope that measures the gate voltage required to change the current through the device by one order of magnitude. In conventional CMOS transistors, the inverse sub-threshold slope is about 60 mV/decade and for decreasing threshold voltages $V_{th}$, the difference between output currents in the ON and OFF state of the transistor decreases. Too small ON/OFF current ratios prevent proper operation of digital circuits that comprise such transistors and are considered one of the major challenges in ultimately scaled devices.

Therefore, there is a need in the art for an improved method of fabricating a field effect transistor.

SUMMARY OF THE INVENTION

In one embodiment, the present invention discloses a method of fabricating a tunneling nanotube field effect transistor. The method comprises forming in a nanotube (or nanowire, i.e., nanotube without axial opening) an n-doped region and a p-doped region that are separated by an undoped channel region of the transistor. Electrical contacts are provided for the doped regions and a gate electrode that is formed upon a gate dielectric layer is deposited on the channel region of the transistor.

Another aspect of the invention is a tunneling nanotube field effect transistor fabricated using the inventive method. Such a transistor may be utilized as an n-type transistor device or a p-type transistor device.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of fabricating a tunneling nanotube field effect transistor using selective doping portions of a nanotube. Herein, the term "nanotube" is interchangeably used for both a nanotube and a nanowire (i.e., nanotube without axial opening). The method may be used in fabrication of ultra-large-scale integrated (ULSI) circuits and devices.

Figure 1:
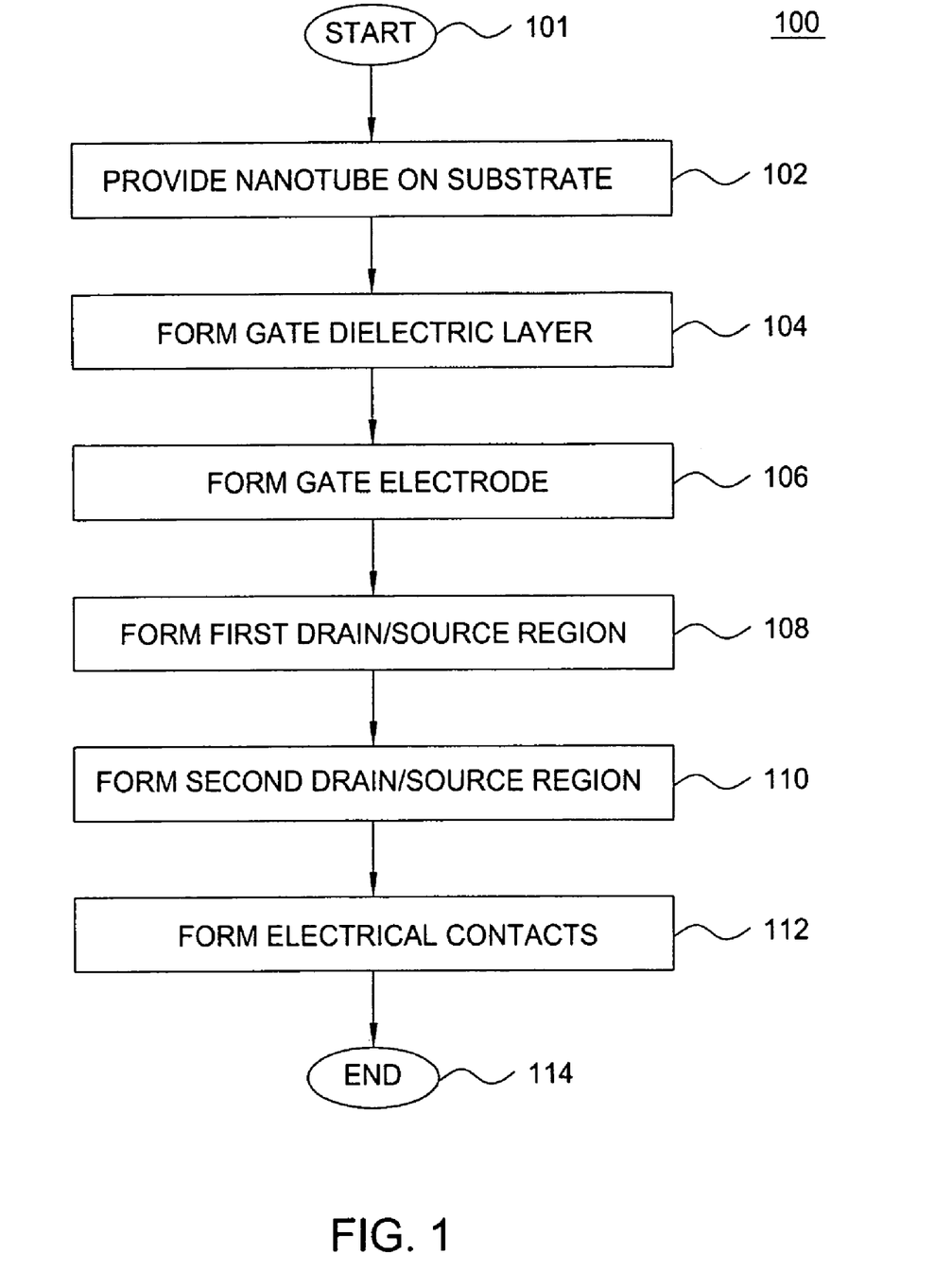
FIG. 1 depicts a flow diagram of a method for fabricating a tunneling nanotube field effect transistor in accordance with one embodiment of the present invention.

FIG. 1 depicts a flow diagram for one embodiment of the inventive method of fabricating a tunneling nanotube field effect transistor as a method 100. The method 100 includes processing steps that are performed upon a substrate where at least one tunneling nanotube field effect transistor is being fabricating. In one illustrative embodiment, such processing steps are sequentially performed in the depicted order. In alternate embodiments, at least two processing steps may be performed contemporaneously or in a different order. Conventional sub-processes, such as application and removal of lithographic masks or sacrificial and protective layers, cleaning processes, and the like, are well known in the art and are not shown in FIG. 1.

Figure 2:
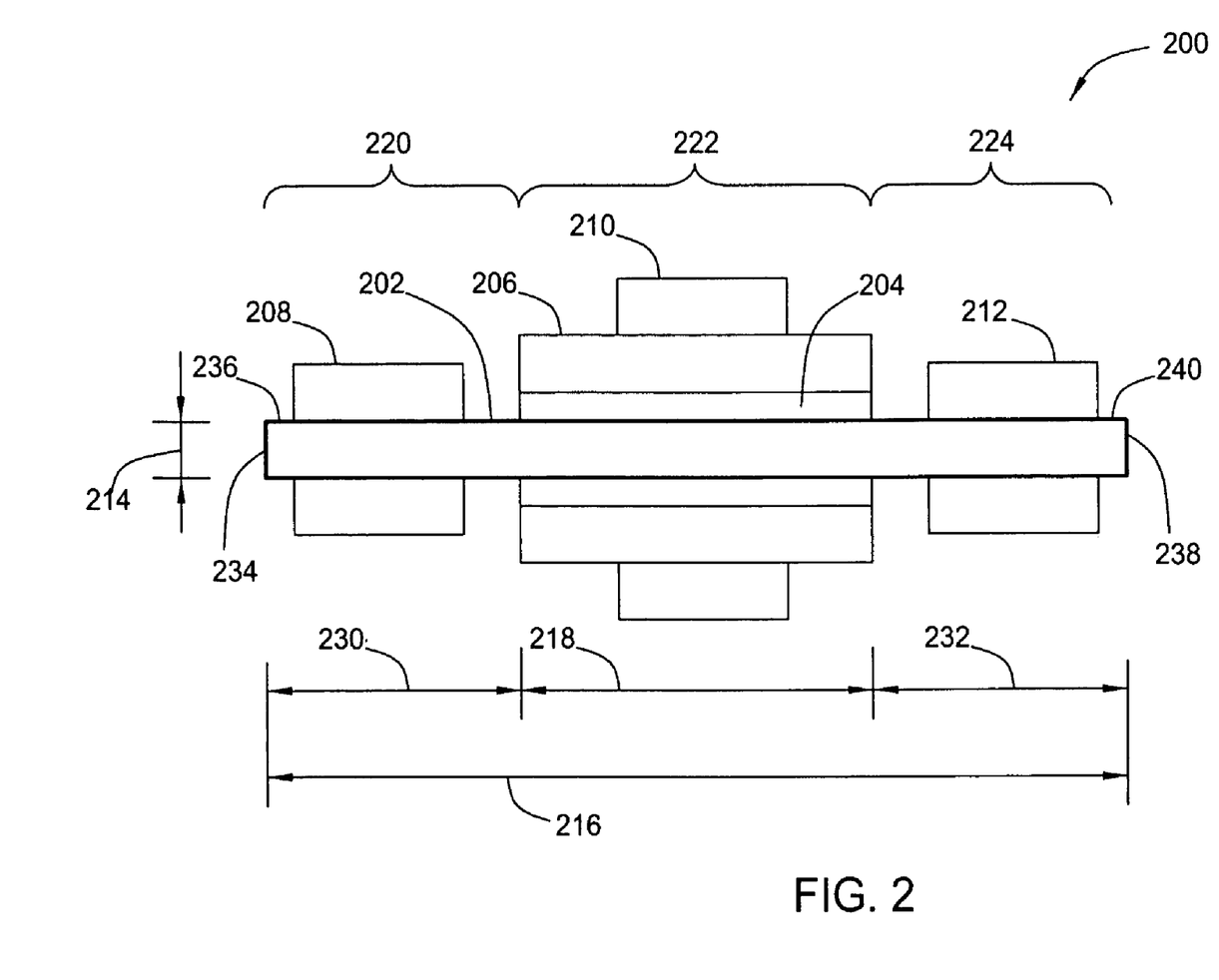
FIG. 2 depicts a schematic diagram of an exemplary tunneling nanotube field effect transistor fabricated using the method of FIG. 1.

FIG. 2 depicts a schematic diagram of an exemplary tunneling nanotube field effect transistor 200 fabricated using the method of FIG. 1. The images in FIG. 2 are not depicted to scale and are simplified for illustrative purposes. To best understand the invention, the reader should simultaneously refer to FIG. 1 and FIG. 2.

The method 100 starts at step 101 and proceeds to step 102. At step 102, a nanotube 202 having semiconducting properties is formed on a substrate (not shown), such as a silicon (Si) or glass wafer, and the like. Best results may be achieved using nanotubes where charge carriers (i.e., electrons and holes) have minimal and similar effective masses (e.g., less than about 0.1 $m_0$, where $m_0$ is the free electron mass), as well as minimal cross-sectional dimensions and facilitate a ballistic mechanism of charge transfer. Methods suitable for forming such nanotubes are disclosed, e.g., in commonly assigned U.S. patent applications Ser. No. 10/102,365 filed Mar. 20, 2002, which is herein incorporated by reference. In one exemplary embodiment, the nanotube 202 is a carbon (C) nanotube having an outer diameter 214 of not greater than about 5 nm (preferably, from about 1 to 3 nm or less) and a length 216 of about 25 to 1000 nm. In alternate embodiments, semiconducting nanotubes from other materials (e.g., silicon or compound semiconductors, such as gallium arsenide (GaAs), indium phosphide (InP), indium gallium arsenide (InGaAs), and the like) may be used to fabricate the transistor 200.

At step 104, a gate dielectric layer 204 is formed over a central region 222 of the nanotube 202. The region 222 may have a length 218 in a range from 5 to 200 nm and represents an intrinsic channel region of the transistor 200 being fabricated. In one exemplary embodiment, the gate dielectric layer 204 comprises silicon dioxide ($SiO_2$) and formed to a thickness of about 1 to 5 nm. Alternatively, the gate dielectric layer 204 may be formed from a high dielectric constant (high-k) material, such as aluminum oxide ($Al_2O_3$), hafnium dioxide ($HfO_2$), and the like. In the depicted embodiment, the gate dielectric layer 204 is formed over the entire channel region 222 and wraps the nanotube 202.

At step 106, a gate electrode 206 is formed upon the gate dielectric layer 204. The gate electrode 206 generally has a thickness from 5 to 50 nm and may comprise at least one of a metal, metal alloy, or a conductive compound. Suitable materials for the gate electrode 206 have high electrical conductivity, as well as compatible with materials of the gate dielectric layer 204 and materials used in electrical wiring (e.g., copper (Cu) wiring) interconnecting the transistor 200 being fabricated to external integrated circuits and devices (discussed below in reference to FIGS. 3–4). In one exemplary embodiment, the gate electrode 206 is formed from titanium (Ti).

The gate dielectric layer 204 and gate electrode 206 may be formed using conventional vacuum deposition techniques, such as atomic layer deposition (ALD), physical vapor deposition (PVD), chemical vapor deposition (CVD), plasma enhanced CVD (PECVD), evaporation, and the like.

At step 108, a first drain/source region 220 is formed in the nanotube 202 adjacent to the channel region 222 by selectively doping the region 220 using at least one n-type dopant. In one exemplary embodiment, a length 230 of the first drain/source region 220 is about 10 to 400 nm. In the depicted embodiment, the first drain/source region 220 extends from the channel region 222 to a first end 234 of the nanotube 202. In an alternative embodiment, a distal portion 236 of the nanotube 202 may be not doped. Suitable n-type dopants include electron donors, such as potassium (K), sodium (Na), molecules of polyethylenimine which is a polymer and in that sense a long chain of molecules, and the like. While segment 220 of the nanotube is being n-doped, other portions of the nanotube can be protected e.g., through the use of a resist layer, a masking layer or alike to prevent doping of other regions of the nanotube.

At step 110, a second drain/source region 224 is formed in the nanotube 202 adjacent to the channel region 222 by selectively doping the region 224 using at least one p-type dopant. In one exemplary embodiment, a length 232 of the second drain/source region 224 is about 10 to 400 nm. In the depicted embodiment, the second drain/source region 224 extends from the channel region 222 to a second end 238 of the nanotube 202. In an alternative embodiment, a distal portion 240 of the nanotube 202 may be not doped. Suitable p-type dopants include hole donors, such as chlorine ($Cl_2$), bromine ($Br_2$), and the like. Again, while segment 224 of the nanotube is being p-doped, other portions of the nanotube can be protected e.g., through the use of a resist layer, a masking layer or alike to prevent doping of other regions of the nanotube.

Selective doping of the first drain/source region 220 and second drain/source region 224 may be performed using a metal/molecule deposition process. The dopants generally are materials with a different electron or hole affinity. In both the p and n types of the deposition process, the nanotube 202 may be doped, in the regions 220 and 224, using a charge transfer from the respective dopant to the nanotube.

At step 112, electrical contacts 208, 210, and 212 are formed upon the first drain/source region 220, gate electrode 206, and second drain/source region 224, respectively. The contacts 208, 210, and 212 are used as terminals for connecting the transistor 200 to external integrated circuits and devices. In an alternate embodiment, the gate electrode 206 may be used as a contact, and, as such, the contact 210 is optional. The contacts 208, 210, and 212 may be formed from at least one conductive material (e.g., a metal, an alloy of the metal, or a conductive compound) that is compatible with respective underlying and overlying material layers. Material of the n-contact (contact 208) should have a smaller work function, than the material of the p-contact (contact 212). In one exemplary embodiment, using a conventional vacuum deposition technique, the contacts 208 and 212 are formed from aluminum (Al) and palladium (Pd), respectively, and the contact 210 is formed from titanium (Ti).

Upon completion of step 112, fabrication of the tunneling nanotube field effect transistor 200 is completed. At step 114, the method 100 ends.

In integrated circuits, the tunneling nanotube field effect transistor 200 may be used as either an n-type transistor device or a p-type transistor device.

Figure 3:
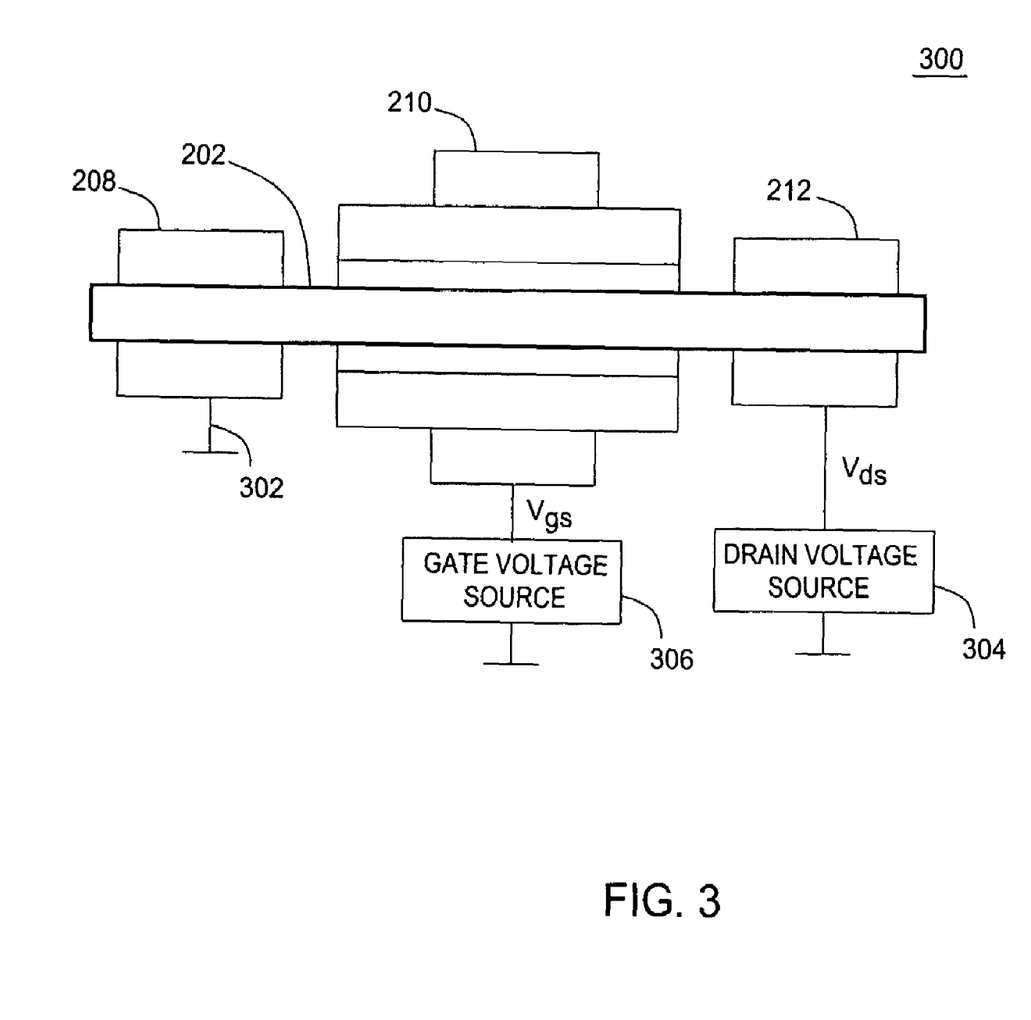
FIG. 3 depicts an exemplary circuit configuration for using the transistor of FIG. 2 as a p-type transistor device.

FIG. 3 depicts an exemplary circuit configuration 300 for using the transistor 200 as the p-type transistor device. In one embodiment, the circuit configuration 300 comprises the transistor 200, a source 302 of a ground, or common, potential (i.e., ground terminal) coupled to the contact 208, a source 304 of a drain voltage $V_{ds}$ coupled to the contact 212, and a source 306 of a gate voltage $V_{gs}$ coupled to the contact 210. In operation, the sources 304 and 306 apply controlled positive potentials (i.e., negative voltages) to the contacts 212 and 210, respectively, while the voltages $V_{ds}$ and $V_{gs}$ are equal to or less (i.e., negative voltages) than the ground potential.

Figure 4:
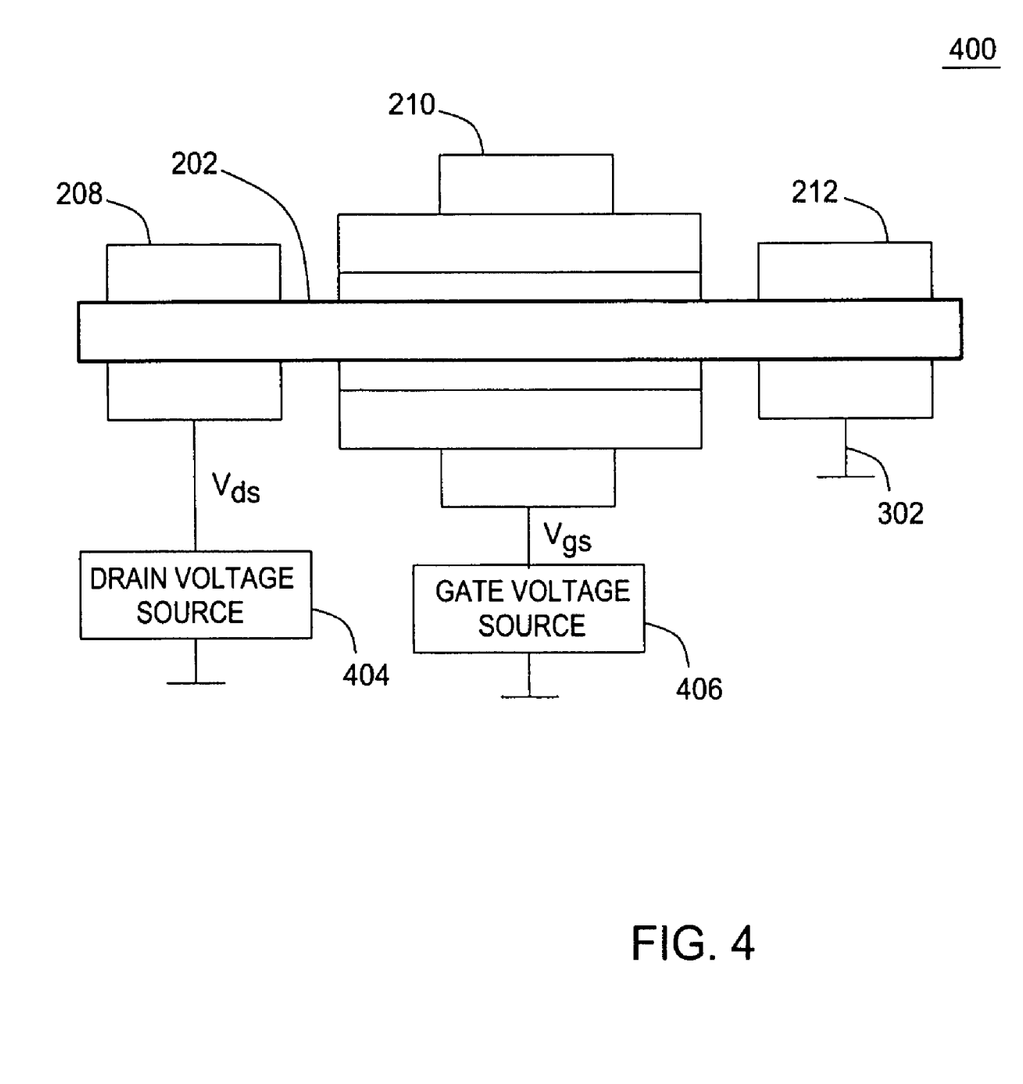
FIG. 4 depicts an exemplary circuit configuration for using the transistor of FIG. 2 as an n-type transistor device.

FIG. 4 depicts an exemplary circuit configuration 400 for using the transistor 200 as the n-type transistor device. In one embodiment, the circuit configuration 400 comprises the transistor 200, a source 302 of the ground potential coupled to the contact 212, a source 404 of the drain voltage $V_{ds}$ coupled to the contact 208, and a source 406 of the gate voltage $V_{gs}$ coupled to the contact 210. In operation, the sources 404 and 406 apply controlled negative potentials (i.e. positive voltages) to the contacts 208 and 210, respectively, while the voltages $V_{ds}$ and $V_{gs}$ are equal to or greater (i.e., positive voltages) than the ground potential.

Figure 5:
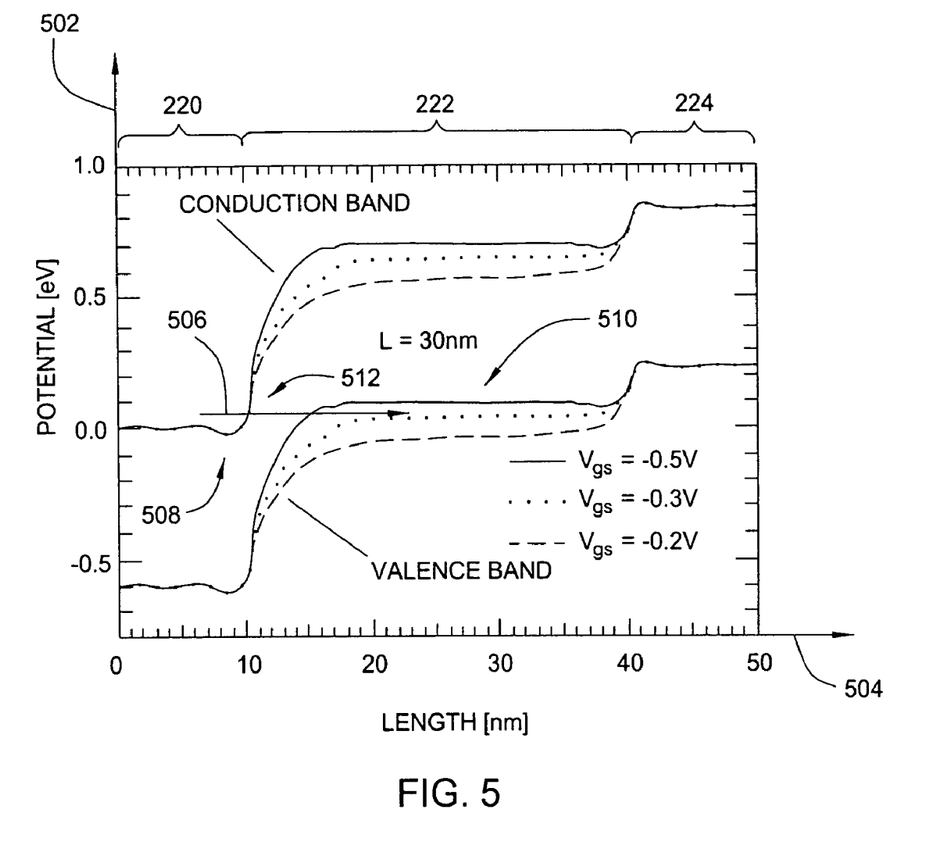
FIG. 5 depicts exemplary graphs illustrating profiles of conduction and valence bands in a nanotube material of the transistor of FIG. 2.

FIG. 5 depicts a series of exemplary graphs illustrating dependence of profiles of conduction and valence bands (y-axis 502) in the carbon nanotube material (x-axis 504) of the transistor 200 from a distance along the carbon nanotube 202. In the depicted embodiment, the transistor 200 comprises the first and second drain/source regions 220 and 224 having the respective lengths 230 and 232 of about 10 nm and the channel region 222 having the length 218 of about 30 nm. Depicted graphs of the conduction and valence bands relate to the circuit configuration 300 where the transistor 200 performs as a p-type device, at the drain voltage $V_{ds}$=−0.1V applied to the contact 212, and at the gate voltages $V_{gs}$ in a range from −0.2 to −0.5V. Effective quantum mechanical tunneling of charge carriers in the transistor 200 (i.e. flow of charge carriers through the transistor) is possible when a lower boundary 508 of the conduction band in the first drain/source region 220 is located below an upper boundary 510 of the valence band in the channel region 222 of the transistor, thus forming a potential, or vertical, gap 512 between the conduction and valence bands. As illustrated using an arrow 506, in the carbon nanotube 202, such effective tunneling between the valence band and the conduction band exists at the gate voltages $V_{gs} \leq -0.3V$ (e.g., at $V_{gs} = -0.5V$). Correspondingly, at $V_{gs} > -0.3V$ (e.g., at $V_{gs} = -0.2V$), there is no such a gap and effective tunneling between the valence and conduction bands. In operation, at $V_{gs} \leq -0.3V$, the p-type transistor 200 asserts an ON (conducting) state and, correspondingly, at $V_{gs} > -0.3V$, the transistor asserts an OFF (non-conducting) state.

Figure 6:
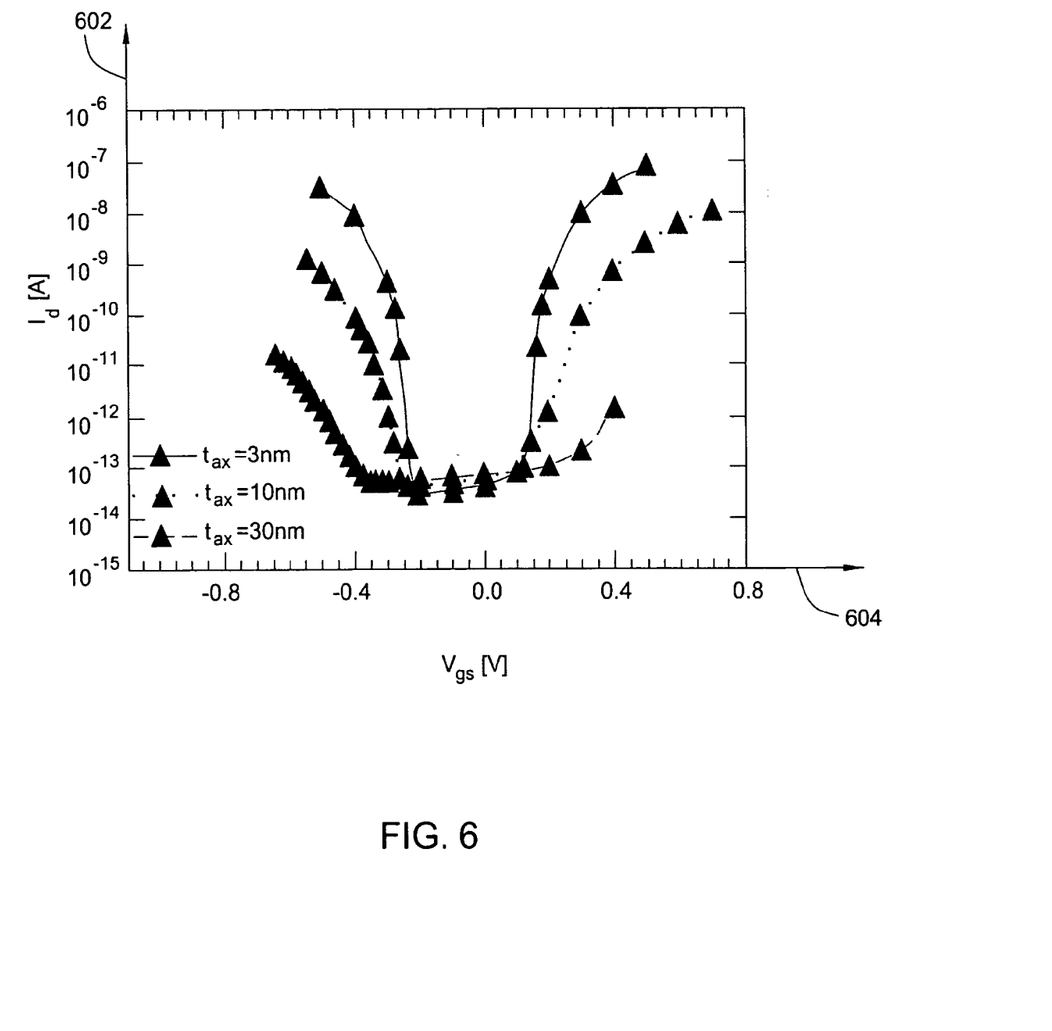
FIGS. 6–8 depict exemplary graphs illustrating characteristics of the transistor of FIG. 2.

FIG. 6 depicts a series of exemplary graphs illustrating dependence of an output current $I_d$ (y-axis 602) from the gate voltage $V_{gs}$ (x-axis 604) of the exemplary p-type transistor 200 having a thickness $t_{ox}$ of the $SiO_2$ gate dielectric layer 204 in a range from 3 to 30 nm. These graphs may be used to calculate an inverse sub-threshold slope $S \sim dV_{gs}/d\log(I_d)$ of the transistor 200. The inverse sub-threshold slope S is a measure of the switching characteristic of a transistor and determines a difference in the gate voltage $V_{gs}$ that causes an order of magnitude (i.e., decade) change of the output current $I_d$ of the transistor. In the transistor 200 having the thickness of the $SiO_2$ gate dielectric layer 204 to $t_{ox} = 3$ nm, the inverse sub-threshold slope S is about 16 mV/decade for the output currents $I_d$ in a range between 0.1 pA and 0.1 nA and about 27 mV/decade for the output currents in a range from 1 pA to 1 nA, respectively. As such, the transistor 200 significantly outperforms conventional complimentary metal-oxide-semiconductor (CMOS) field effect transistors having the inverse sub-threshold slope $S \sim 60$ mV/decade, while operating at the same gate voltages $V_{gs}$ as the CMOS transistors.

Figure 7:
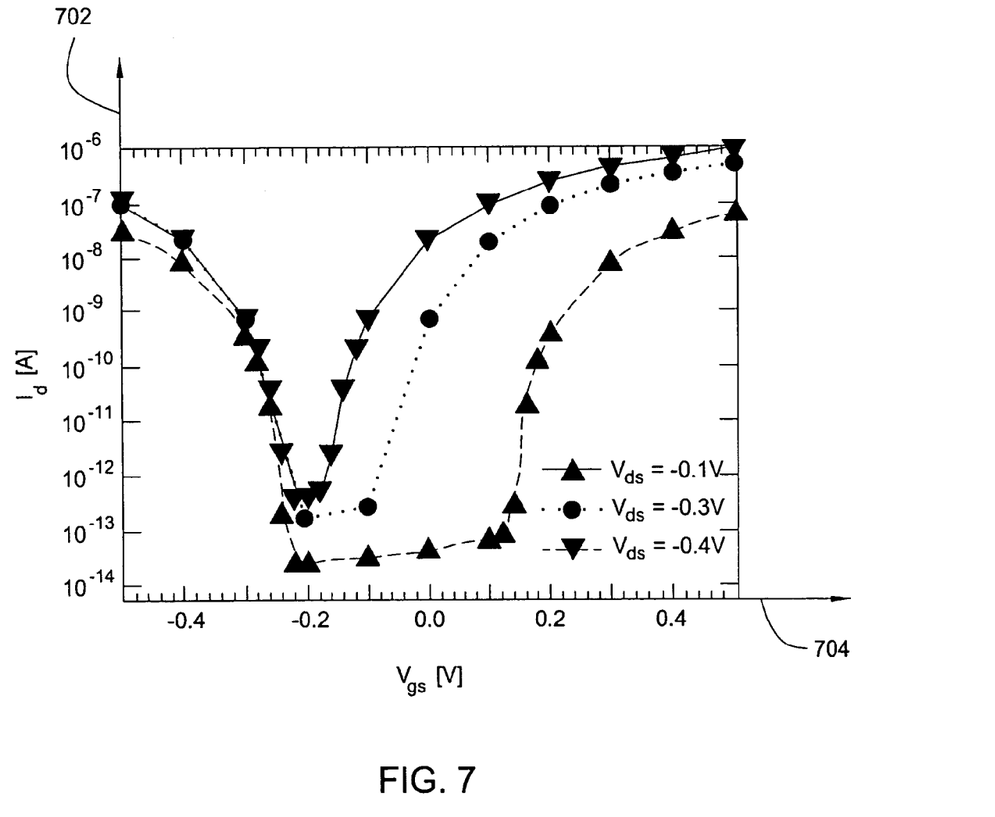

FIG. 7 depicts a series of exemplary graphs illustrating the dependence of the output current $I_d$ (y-axis 702) from the gate voltage $V_{gs}$ (x-axis 704) of the exemplary p-type transistor 200 of FIG. 6 having the thickness $t_{ox} = 3$ nm at the drain voltages $V_{ds}$ in a range from −0.1 to −0.4V. In common with other p-type transistor devices, characteristics of the transistor 200 remain unchanged and do not show a drain induced barrier lowering-like (DIBL-like) effect at the negative gate voltages $V_{gs}$.

Figure 8:
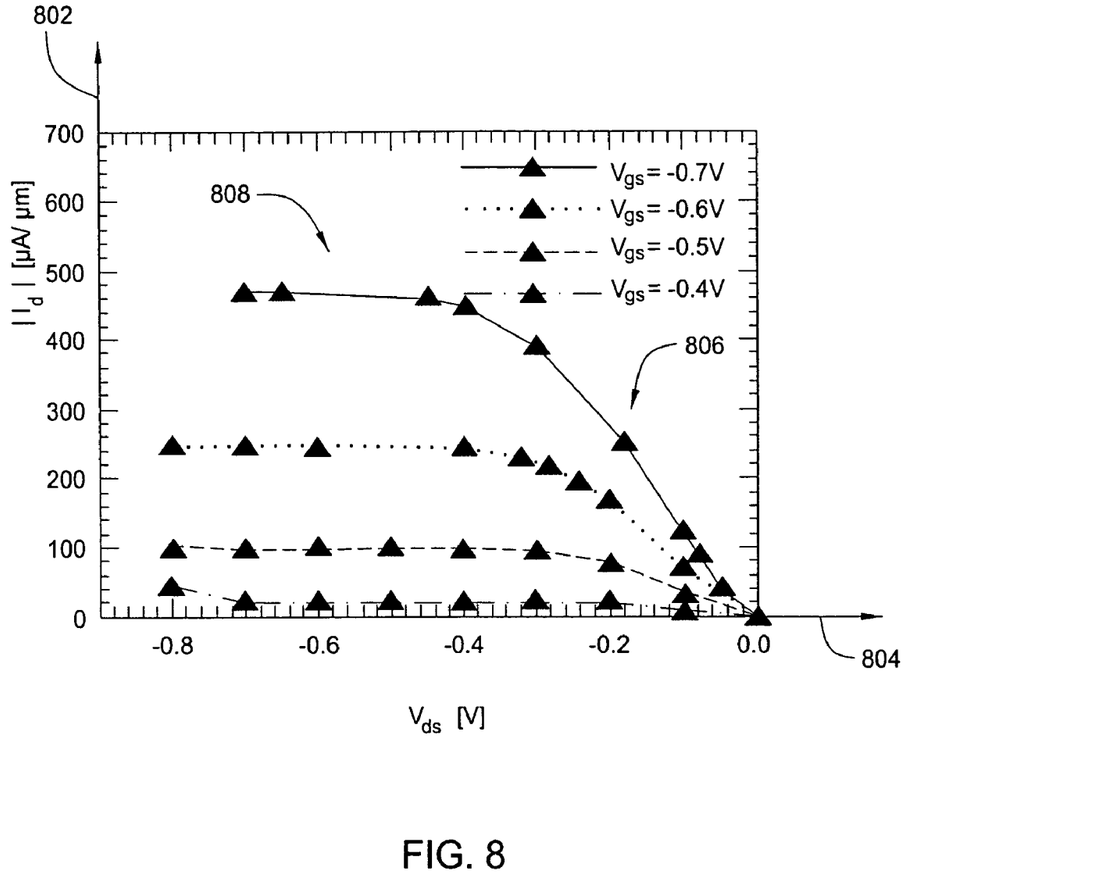

FIG. 8 depicts a series of exemplary graphs illustrating output characteristics of the exemplary p-type transistor 200 of FIG. 2. More specifically, the graphs in FIG. 8 show dependence of the output current $I_d$ (y-axis 802) from the drain voltage $V_{ds}$ (x-axis 804) at the gate voltages $V_{gs}$ in a range from −0.4 to −0.7V. The transistor 200 has output characteristics with a linear region 806 at small drain voltages $V_{ds}$ and a saturation region 808 at large drain voltages.

The inventive tunneling nanotube field effect transistors have a favorable combination of characteristics for use in the integrated circuits: small footprint and minimal power consumption in combination with the low inverse sub-threshold slope S that, in a broad range of drain voltages, is independent from drain voltage, as well as attainable at low threshold voltage and low gate and drain voltages. Furthermore, the tunneling nanotube field effect transistors have output characteristics that are compatible with ones of the CMOS transistors and, as such, may be used in integrated circuits together with the CMOS transistors or as a replacement for the CMOS transistors.

While the foregoing is directed to the illustrative embodiment of the present invention, other and further embodiments of the invention may be devised without departing from the basic scope thereof, and the scope thereof is determined by the claims that follow.

The invention claimed is:

1. A method of fabricating a tunneling nanotube field effect transistor, comprising:

providing a nanotube having semiconducting properties;

defining in the nanotube a channel region, a first drain/source region, and a second drain/source region of the transistor, the first drain/source region adjacent a first end of the channel region and the second drain/source region adjacent a second end of the channel region;

forming a gate dielectric layer on the channel region;

forming a gate electrode on the gate dielectric layer;

selectively doping the first drain/source region using an n-type dopant;

selectively doping the second drain/source region using a p-type dopant; and forming at least one electrical contact on each of the gate electrode and said drain/source regions.

2. The method of claim 1 wherein the nanotube has no axial opening.

3. The method of claim 1 wherein the nanotube is one of a carbon (C) nanotube, a silicon (Si) nanotube, and a nanotube comprising a compound semiconductor.

4. The method of claim 3 wherein the compound semiconductor is one of gallium arsenide (GaAs), indium phosphate (InP), and indium gallium arsenide (InGaAs).

5. The method of claim 1 wherein an outer diameter of the nanotube is less than about 5 nm.

6. The method of claim 1 wherein doping facilitates in the channel region effective quantum mechanical tunneling of charge carriers.

7. The method of claim 1 wherein the n-type dopant comprises at least one of potassium (K), sodium (Na), and molecules of polyethylenimine.

8. The method of claim 1 wherein the p-type dopant comprises at least one of chlorine ($Cl_2$) and bromine ($Br_2$).

9. The method of claim 1 wherein doping is performed using a metal/molecule deposition process.

10. The method of claim 1 wherein the gate dielectric layer is formed from at least one of $SiO_2$, $HfO_2$, and $Al_2O_3$ to a thickness of about 1 to 10 nm.

11. The method of claim 1 wherein the gate electrode is formed from at least one of a metal, an alloy of the metal, or a conductive compound.

12. The method of claim 1 wherein at least one electrical contact is formed from at least one of a metal, an alloy of the metal, or a conductive compound.

13. The method of claim 1 wherein the gate dielectric layer, gate electrode, and at least one electrical contact are formed using vacuum deposition processes.

14. A tunneling nanotube field effect transistor, comprising:

a channel region defined in a nanotube, the channel region having semiconducting properties;

a gate dielectric layer formed on the channel region;

a gate electrode formed on the gate dielectric layer;

a first drain/source region formed in the nanotube adjacent a first end of the channel region, the first drain/source region selectively doped using an n-type dopant;

a second drain/source region formed in the nanotube adjacent a second end of the channel region, the second drain/source region selectively doped using a p-type dopant; and at least one electrical contact on each of the gate electrode and said drain/source regions.

15. The transistor of claim 14 wherein the first drain/source region is coupled to a source of a ground potential, the second drain/source region is coupled to a source of a drain voltage, and the gate electrode is coupled to a-source of a gate voltage thereby forming a p-type transistor device.

16. The transistor of claim 15 wherein voltages at the second drain/source region and gate electrode are equal to or less than the ground potential.

17. The transistor of claim 14 wherein the second drain/source region is coupled to a source of a ground potential, the first drain/source region is coupled to a source of drain voltage, and the gate electrode is coupled to a source of a gate voltage thereby forming an n-type transistor device.

18. The transistor of claim 17 wherein voltages at the first drain/source region and gate electrode are equal to or greater than the ground potential.

19. The transistor of claim 14 wherein the nanotube has no axial opening.

20. The transistor of claim 14 wherein the nanotube is one of a carbon (C) nanotube, a silicon (Si) nanotube, and a nanotube comprising a compound semiconductor.

21. The transistor of claim 20 wherein the compound semiconductor is one of gallium arsenide (GaAs), indium phosphate (InP), and indium gallium arsenide (InGaAs).

22. The transistor of claim 14 wherein an outer diameter of the nanotube is less than 5 nm.

23. The transistor of claim 14 wherein doping facilitates in the channel region effective quantum mechanical tunneling of charge carriers.

24. The transistor of claim 14 wherein the n-type dopant comprises at least one of potassium (K), sodium (Na), and molecules of polyethylenimine.

25. The transistor of claim 14 wherein the p-type dopant comprises at least one of chlorine ($Cl_2$) and bromine ($Br_2$).

26. The transistor of claim 14 wherein doping is performed using a metal/molecule deposition process.

27. The transistor of claim 14 wherein the gate dielectric layer is formed from at least one of $SiO_2$, $HfO_2$, and $Al_2O_3$ to a thickness of about 1 to 10 nm.

28. The transistor of claim 14 wherein the gate electrode is formed from at least one of a metal, an alloy of the metal, or a conductive compound.

29. The transistor of claim 14 wherein the at least one electrical contact is formed from at least one of a metal, an alloy of the metal, or a conductive compound.

30. The transistor of claim 14 wherein the gate dielectric layer, gate electrode, and the at least one electrical contact are formed using vacuum deposition processes.

* * * * *